United States Patent [19]

Kawakami

[11] 4,355,412
[45] Oct. 19, 1982

[54] PRESET STATION SELECTING DEVICE IN A RADIO RECEIVER

[75] Inventor: Yasushi Kawakami, Tokyo, Japan

[73] Assignee: Nissan Motor Company, Limited, Japan

[21] Appl. No.: 138,334

[22] Filed: Apr. 8, 1980

[30] Foreign Application Priority Data

Apr. 10, 1979 [JP] Japan .............................. 54-46433[U]
Apr. 16, 1979 [JP] Japan .............................. 54-49393[U]

[51] Int. Cl.³ ............................................ H04B 1/16
[52] U.S. Cl. ..................................... 455/175; 455/186; 365/189; 200/6 R; 200/339
[58] Field of Search ............... 455/170, 175, 177, 185, 455/186; 365/189; 200/6 R, 6 B, 6 BB, 6 BA, 291, 318, 339

[56] References Cited

U.S. PATENT DOCUMENTS

| | | | |
|---|---|---|---|
| 3,974,347 | 8/1976 | Lockard | 200/339 |
| 3,986,054 | 10/1976 | Hansen et al. | 365/189 |
| 4,023,107 | 5/1977 | Tanaka | 455/186 |
| 4,086,548 | 4/1978 | Robbins et al. | 200/6 B |

FOREIGN PATENT DOCUMENTS

| | | |
|---|---|---|
| 1208849 | 10/1970 | United Kingdom . |
| 1363048 | 8/1974 | United Kingdom . |
| 1416532 | 12/1975 | United Kingdom . |
| 1435697 | 5/1976 | United Kingdom . |
| 1471712 | 4/1977 | United Kingdom . |
| 1518368 | 7/1978 | United Kingdom . |
| 1518712 | 7/1978 | United Kingdom . |
| 1553366 | 9/1979 | United Kingdom . |

*Primary Examiner*—Jin F. Ng

[57] ABSTRACT

In a radio receiver which is electrically tuned to a broadcasting frequency, a preset station selecting device having a memory, a first circuit which previously writes a broadcasting frequency into the memory when it receives a write selection and write command, and a second circuit which reads the broadcasting frequency out of the memory and sets the frequency in the receiver. The station selecting device further includes a switch which in turn includes a switchable member which has two switched positions. This switch gives a write selection/write command to the first circuit when the switchable member is at one switched position, and a read command to the second circuit when the switchable member is at the other switched position.

12 Claims, 6 Drawing Figures

PRESET STATION SELECTING DEVICE IN A RADIO RECEIVER

BACKGROUND OF THE INVENTION

The present invention relates to a radio receiver, and more particularly to a preset station selecting device for use in a radio receiver.

Recently, radio receivers have come into wide use which can be electronically tuned to broadcasting frequencies using a phase-locked loop. Especially, in radio receivers used in automotive vehicles, in addition to the electronic tuning function, a station selecting device has come into practical use which uses tuning frequency information stored in a memory for tuning into broadcasting stations. This device has a function to write the frequency information relating to a selected station into a memory, and to read the information out of the memory, in order to select the broadcast station. Commands for these operations are sent by switching operations. This station selecting device is so constituted that writing in the memory is effected by receiving a write-ready command and a write command. Thus two switches are needed, one for making the memory ready for writing, and another for actually writing frequency information into the memory. In presetting the radio receiver, these two switches are both operated.

When an automotive vehicle is making a long trip, the broadcasting stations which can be received are liable to vary from place to place. In this case, a new station cannot be received, using the old tuning frequency used so far, although the energy of the new broadcasting frequency may be sufficiently strong. When the new station is desired to be received in automatic selection mode, its frequency must be newly set.

In such a case, two switches must be operated, one for starting preparation for writing, and the other for starting actual writing, in the prior art devices.

SUMMARY OF THE INVENTION

It is therefore an object of the present invention to provide a preset station selecting device in a radio receiver, wherein a single switch gives at one switched position a command to prepare for writing, and/or to actually write, a broadcasting frequency into a memory and gives at another switched position another command to read the frequency out of the memory, thereby simplifying a selecting operation of the broadcasting frequency.

BRIEF DESCRIPTION OF THE DRAWINGS

Other objects, features and advantages of the present invention will be more apparent from the following description, taken in conjunction with the accompanying drawings, which are given by way of illustration only and not limitative to the present invention.

In the drawings.

Figure 1:
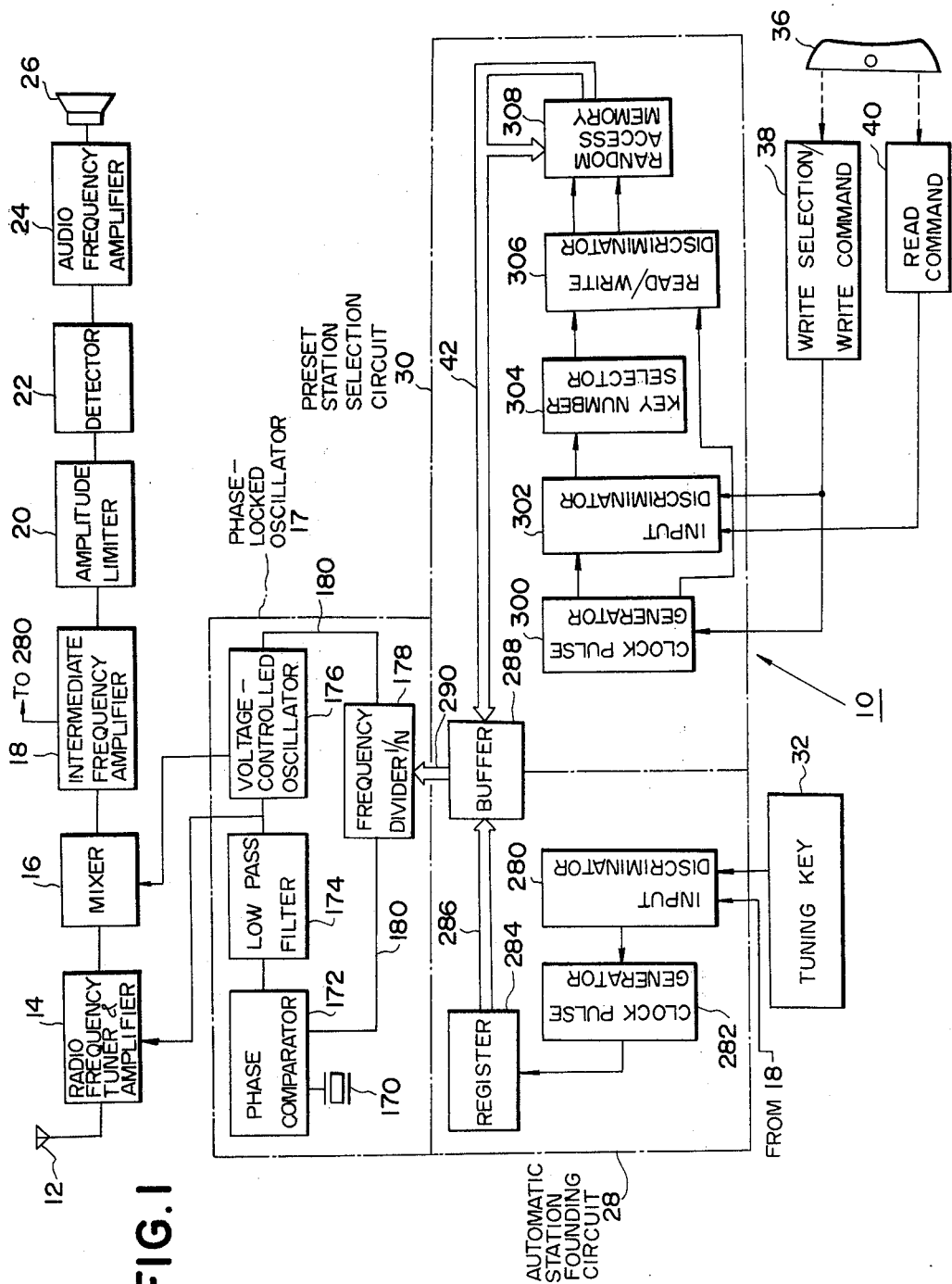
FIG. 1 is a block diagram of a radio receiver incorporating a preset station selecting device according to one embodiment of the present invention.

Throughout the drawings, reference numerals which are the same except for suffixes "a" and "b", designate corresponding members in the several embodiments.

DETAILED DESCRIPTION OF THE PREFERRED EMBODIMENTS

Referring to the drawings and particularly to FIG. 1, a radio receiver which incorporates a preset station selecting device according to the present invention is shown, generally designated by reference numeral 10. A broadcast wave received by an antenna 12 is introduced into a radio frequency tuner and amplifier circuit 14. The broadcasting frequency of the wave is then transformed in a mixer 16 to an intermediate frequency. A conventional phase-locked oscillator 17 includes a phase-locked loop which sets a tuning frequency and a local oscillating frequency for the circuit 14 and the mixer 16, respectively. The intermediate frequency from the mixer 16 is introduced through an intermediate frequency amplifier 18 and an amplitude limiter 20 to a detector 22 where the intermediate frequency is changed to a low frequency signal, which is amplified by an audio-frequency amplifier 24 and which is supplied to a speaker 26.

The phase-locked oscillator 17 includes a crystal oscillator 170, a phase comparator 172, a low-pass filter 174, a voltage-controlled oscillator 176, a frequency divider 178, and a loop 180 which connects these elements. The tuning frequency for the circuit 14 and the local oscillating frequency for the mixer 16 are determined by the frequency divisor in the frequency divider 178.

An automatic station finding circuit 28 includes an input discriminator 280 which senses whether the frequency of the phase-locked oscillator 17 should be increased when a tuning key 32 is pressed down, a clock pulse generator 282 which is started or stopped by the output of the discriminator 280, and a divisor value setting register 284 whose preset numerical value is incremented or decremented by clock pulses from the clock pulse generator 282. The value in the register 284 is fed, through a bus 286, a buffer 288 and a bus 290, to the divider 178, so as to be used as the divisor N therein. The input signal to the intermediate frequency amplifier 18 is also supplied to the input discriminator 280. When this input signal exceeds a predetermined level, the discriminator 280 causes the clock pulse generator 282 to stop sending clock pulses, in which case, the content of the register 284 is sent through the buffer 288 and set as the divisor N in the divider 178.

On the other hand, a preset station selection circuit 30 includes a clock pulse generator 300, an input discriminator 302 which detects which of a write selection/write command circuit 38 and a read command circuit 40 has been operated, a key number selector 304 which sends the number of an operated preset station selector key 36 as address information, a read/write discriminator 306, and a random access memory (RAM) 308 which stores frequency information fed through a bus 42.

Figure 2:
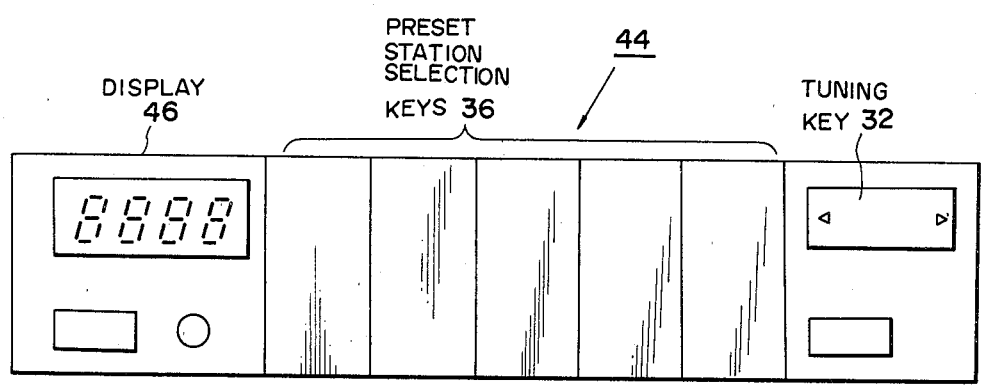
FIG. 2 is a schematic illustration of the operation panel of the receiver.
Figure 3:
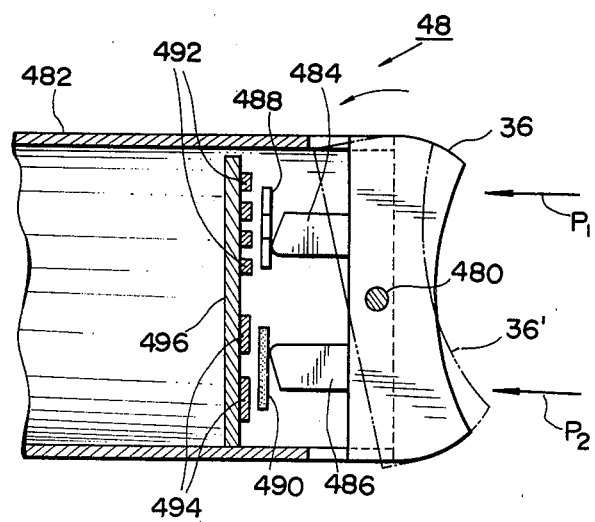
FIG. 3 is a sectional view of a preset station selecting switch shown in FIG. 1.

Referring to FIG. 2, an operation panel, generally designated by 44, of the radio receiver includes the key 32, a display 46 which indicates the frequency of a selected station, and a plurality of preset station selection keys 36 which send a write selection/write command, or a read command. As shown in FIG. 3, each key 36 is a part of a corresponding switch 48, which includes a pivot 480 secured to a fixed frame 482 and by which the key is pivotally supported, the key being normally held at a neutral position by a biasing member, not shown. The preset key is provided with two parallel legs 484 and 486 made of an electrically insulating material and protruding backwards from the back of the key. Each switch further includes two electrically conductive contact members 488 and 490, which are made of electrically conductive rubber and which face the legs 484 and 486, and two groups of electrical contacts 492 and 494 formed on a printed circuit board 496. These two groups of electrical contacts 492 and 494 are electrically connected by the corresponding contact members 488 and 490, when contacted thereby. Thus, when the preset key 36 is pressed in the direction shown by the arrow $P_1$ in FIG. 3, it is rotated up to the position shown by the phantom line 36', so that the leg 484 presses the contact member 488 against the contacts 492, thereby connecting these contacts. This causes a write selection/write command to be sent, for setting frequency information in the RAM 308 of the preset station selection circuit 30. When the key is pressed in the opposite direction shown by the arrow $P_2$, the contacts 494 are closed by the conductive contact member 490, which is pressed by the leg 486, whereby a read command to read the frequency information set in the RAM 308 is sent.

In operation, the tuning key 32 may be automatically or manually operated. The input discriminator 280 discriminates whether the sweep frequency should be increased and, if so, starts the clock pulse generator 282. The clock pulses from the generator 282, once started, change the value preset in the register 284 either up or down. The count in the register 284 is sequentially set as "N" in the frequency divider 178 of the phase-locked oscillator 17 through the buffer 288, so as to vary the oscillating frequency from the oscillator 17, on the basis of the ratio "1/N", using the phase-locked loop structure. Thus the tuning and local oscillating frequencies for the tuning circuit 14 and the mixer 16 are varied over the respective ranges of frequency.

This varying of the oscillating frequency causes the receiver to be tuned to the broadcasting frequency. When the level of the received signal at the input stage of the intermediate frequency amplifier 18 exceeds a predetermined value, this input signal is applied as a selection stop signal to the input discriminator 280 of the automatic station finding circuit 28 to stop the clock pulse generator 282. Thus the content of the register 284 is set at the value of "N" when the oscillating frequency of the oscillator 17 has tuned to the broadcasting frequency with the result that the oscillating frequency from the oscillator 17 is locked to a frequency determined by the divisor which is the value in the register 284. Accordingly the automatic station finding is completed.

Under these circumstances, presetting of the broadcast frequency, using the preset station selection circuit 30, is carried out as follows. First, the preset key 36 is pressed in the direction of write selecting and writing, i.e. in the direction of the arrow $P_1$ in FIG. 3. Then the write selection/write command circuit 38 sends a command to the clock pulse generator 300 and the input discriminator 302 to cause the clock pulse generator 300 to generate clock pulses and send the same to the input discriminator 302 to put the RAM 308 into a write enable situation. At the same time, the input discriminator 302 gives the number of the pressed key 36 to the key number selector 304, thereby causing the same to specify a write address in the memory 308. The read/write discriminator 306 determines that a write command has been sent to the RAM 308 when the clock pulse generator 300 has already been started. This causes the tuning frequency information, i.e. the divisor value set in the register 284, to be written through the bus 42 in the address corresponding to the pressed key.

As will be seen from the above, the selection device according to the present invention effects write selecting and writing of the frequency information given during driving, into the RAM 308, by only one operation of depressing the corresponding preset key 36.

The reading of the frequency information, once it is preset in the memory, is effected as follows. When a preset key 36 is depressed as shown by the arrow $P_2$ in FIG. 3, a read command is fed to the input discriminator 302, at which time, however, the clock pulse generator 300 is not started. Thus the read/write discriminator 306 determines that the command is for reading. This causes the frequency information stored in the RAM 308 at the address specified by the key number selector 304 to be read out of the RAM 308 and to be set through the buffer 288 in the frequency divider 178 of the phase-locked oscillator 17. Thus the phase-locked oscillator 17 is locked in oscillating frequency to the frequency read from the RAM 308, thereby allowing the reception of the desired broadcasting frequency.

Figure 4:
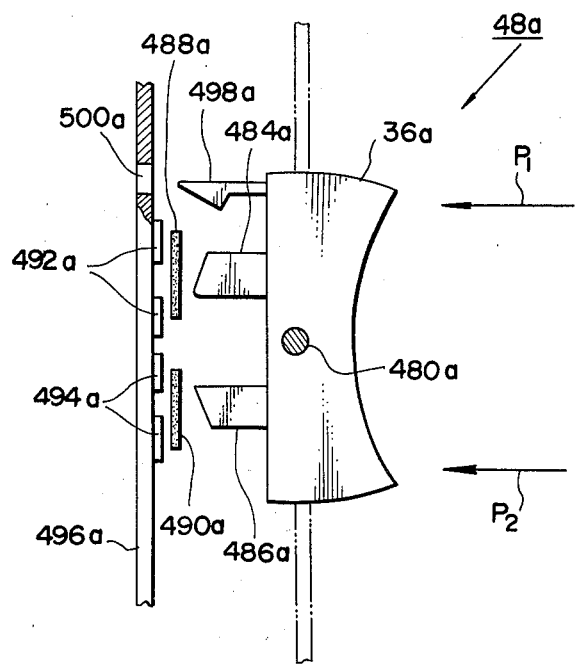
FIG. 4 is a possible modification of the switch.

Referring to FIG. 4, a modification of the switch used in the present invention is shown at 48a, which is of substantially the same structure as the switch of FIG. 3, except that the switch has a lock member 498a extending backwards from the back of a key 36a, and a hole 500a provided in the printed circuit board 476a.

When the key 36a is pressed from its neutral position in the direction shown by the arrow $P_1$, in order to effect writing, it rotates about the pivot 480a thereby causing the leg 484a to contact the conductive contact member 488a against the contacts 492a, with the result that the contacts 492a are connected, and the selected frequency is written into the memory, as in the first embodiment of FIGS. 1 to 3. At this time, the lock member 498a is engaged in the hole 500a in the board 496a and locked there. Under these circumstances, the key remains in depressed position, thereby providing a tactual sensation that the frequency is written into the memory. Further, it is possible to visually and tactually ascertain which of the keys 36a is operated.

Figure 5:
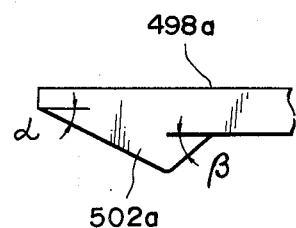
FIG. 5 is a fragmentary view of a lock member of the FIG. 4 modification.

The locked down key 36a may be released by pressing the key in the direction of the arrow $P_2$, whereby the lock member 498a is disengaged from the hole 500a and returned to its neutral position. In this modification, it is so arranged that the operating force $P_1$ required to press the key for locking differs from the force $P_2$ required to release the key for returning it to the neutral position. To this end, the lock member 498a has a triangular end portion 502a attached at one side thereof to a free end portion of the lock member, as is best illustrated In FIG. 5. The triangular end portion 502a has two different base angles, i.e. the gradients of the two free sides vary with respect to the locking direction, thus functioning as an entry angle $\alpha$ and a release angle $\beta$, respectively. For example, it is so arranged that $P_1 = 500$ to 600 grams and $P_1 = 70$ to 100 grams, thereby providing sufficient discrimination between the two operating tactual sensations.

On the other hand, when the key 36a in the neutral position is depressed in the direction of the arrow P₂, the leg 486a causes the conductive contact member 490a to contact the contacts 494a and connect the same, thereby reading the memory. When this reading of the frequency out of the memory is effected, the broadcast whose frequency is read is obtained as received sound. Accordingly, it is unnecessary to confirm the reading of the frequency in any visual or tactual manner. Thus no locking means is provided for the reading operation.

Figure 6:
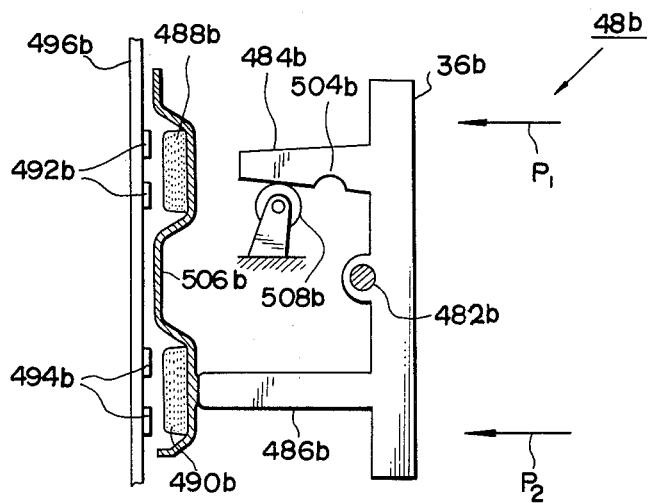
FIG. 6 is a second possible modification of the switch.

Referring to FIG. 6, a second modification of the switch used in the present invention is shown, which is of the same structure as that of FIG. 3, except that a leg 484b is provided with a recess 504b on one slanted side thereof, the other leg 486b is longer than the leg 484b, contact members 488b and 490b are attached to an electrically insulating contact member 506b of rubber, and a roller 508b pivoted at a fixed point is provided for engaging in the recess 504b in the leg 484b and rolling on the slanted side of the leg 484b.

In operation, when the frequency is to be written in the memory, the key 36b is pressed in the direction of the arrow P₁, and is locked by the engagement of the key recess 504b on the roller 508b, at which time the operating force required is determined by the angle of the slope of the leg 484b in rolling contact with the roller 508b, and the positional relationship between the roller and the recess. The operating force required for depressing the key 36b in the direction of the arrow P₂ is determined by the thickness of the insulating contact member 506b and the thickness of the conductive contact member 490b. Thus the operating force acting in the direction of the arrow P₁ is larger by the resistance force occurring between the leg 484b and the roller 508b than the operation force acting in the direction of the arrow P₂ thereby providing two different tactual sensations due to the switching forces, respectively.

In the two above modifications, a tactual sensation from the switched key available at the one switched position allows to check that a process has been performed of which the results, i.e. the writing of frequency information into the memory, do not appear outside the apparatus. Thus, especially, in the case of a car radio receiver, a visual check is unnecessary.

In the above embodiment and modifications, the switches have been shown as having a seesaw structure, in which a key is turned about a pivot for switching. However, instead of these switches, a conventional push button switch, a conventional toggle switch, etc., may be used. Any locking means for the key may be used which is suitable for the structure of a switch to be used. In order to provide a discrimination between the two operating forces, a conventional spring can be used. The above embodiment and modifications have been described and illustrated as being concerned with the preset station-selecting switch, but are applicable to other operating switches such as, for example, automatic station-selecting switches.

Although the present invention has been shown and described with reference to a particular embodiment and modifications thereof, and with reference to the illustrative drawings, it should not be conceived of as limited thereto; various alternatives, omissions, and modifications to the form and the content of any particular embodiment could be made therein, without departing from the spirit of the invention, or from its scope, and it is therefore desired that this scope should be defined, not by any particular features of the shown embodiment and modifications (which are given, as were the drawings, for the purposes of elucidation only), but solely by the accompanying claims.

What is claimed is:

1. In a radio receiver which is electrically tuned to a broadcasting frequency, a preset station selecting device comprising:
   a memory;
   means for previously writing a broadcasting frequency into the memory when it receives a write selection and write command signal;
   means for reading the broadcasting frequency out of the memory and electrically setting this frequency in the receiver;
   a switch including a switchable member which has two switched positions, the switch being adapted to give a write selection and write command signal to the writing means when the switchable member is at one switched position, and being adapted to give a read command signal to the reading means when the switchable member is at the other switched position;
   the switchable member being supported at a pivotal point in the switch; the switch comprising two parallel electrically insulating legs extending backward from a back of the switchable member, one on each side of the pivotal point, an insulating plate comprising thereon two separate groups of electrical contacts which are disposed so as to align with the two legs respectively, two electrically conductive contact members each disposed between and aligning with one insulating leg and a corresponding group of contacts made of electrically conductive rubber and normally separated from said corresponding group of electrical contacts;
   one of said insulating legs of the switchable member being provided with a recess in one side thereof; and
   a locking roller engaging with the recess at said one switched position of the switchable member.

2. The preset station selecting device of claim 1, wherein the switch is further provided with an insulating resilient member attached to the electrically conductive contact members, the insulating resilient member being positioned between the electrically conductive contact members and the insulating legs, and the insulating member being adapted to be pressed by the switchable member so as to push the contact members to be contacted against their corresponding groups of electrical contacts.

3. The preset station selecting device of claim 1, wherein the other insulating leg is longer than the said one leg which is provided with the recess.

4. In a radio receiver which is electrically tuned to a broadcasting frequency, a preset station selecting device comprising:
   a memory;
   means for previously writing a broadcasting frequency into the memory when it receives a write selection and write command signal;
   means for reading the broadcasting frequency out of the memory and electrically setting this frequency in the receiver;
   a switch including a switchable member which has two switched positions, the switch being adapted to give a write selection and write command signal to the writing means when the switchable member is at one switched position, and being adapted to give a read command signal to the reading means when the switchable member is at the other switched position;

the switchable member being supported at a pivotal point in the switch; the switch comprising two parallel electrically insulating legs extending backward from a back of the switchable member, one on each side of the pivotal point, an insulating plate comprising thereon two separate groups of electrical contacts which are disposed so as to align with the two legs respectively, two electrically conductive contact members each disposed between and aligning with one insulating leg and a corresponding group of contacts made of electrically conductive rubber and normally separated from said corresponding group of electrical contacts;

the switch further comprising a lock member extending backwards from the back of the switchable member on the side of one of the insulating legs away from the pivotal point, and the plate having a hole in which the lock member is locked when the switchable member is moved to said one switched position.

5. The preset station selecting device of claim 4, wherein the lock member has a triangular locking portion attached at one side of a free end portion of the lock member and having an entry angle and a release angle different from each other, so that the forces exerted on the switchable member in each switching case provide different tactual sensations.

6. In a radio receiver which is electrically tuned to a broadcasting frequency, a preset station selecting device, comprising:

a memory;

a switch having a particular number and including a switchable member which has two switched positions;

write selection and write command means responsive to one of said two switched position of said switchable member for giving a write selection and write command signal;

a clock pulse generator responsive to the write selection and write command signal for generating clock pulses;

read command means responsive to the other of the two switched positions for giving a read command signal;

an input discriminator responsive to the presence of the clock pulses for putting the memory into a write enable situation, responsive to the write selection and write command signal for producing a signal representing the number of the switch;

a key number selector responsive to the signal representing the number of the switch for specifying a write address in the memory; and a read/write discriminator responsive to the presence of the clock pulses for writing a tuned frequency information in the specified address, and responsive to the absence of the clock pulses for reading the frequency information out of the memory.

7. The preset station selecting device of claim 6, wherein the switchable member is supported at a pivotal point in the switch; wherein the switch comprises two parallel electrically insulating legs extending backward from a back of the switchable member, one on each side of the pivotal point, an insulating plate comprising thereon two separate groups of contacts made of electrically conductive rubber which are disposed so as to align with the two legs respectively, two electrically conductive contact members each disposed between and aligning with one insulating leg and a corrresponding group of electrical contacts and normally separated from said corresponding group of electrical contacts.

8. The preset station selection device of claim 7, wherein the switch further comprises a lock member extending backwards from the back of the switchable member on the side of one of the insulating legs away from the pivotal point, and wherein the plate has a hole in which the lock member is locked when the switchable member is moved to said one switched position.

9. The preset station selecting device of claim 8, wherein the lock member has a triangular locking portion attached at one side thereof to a free end portion of the locking member, and having an entry angle and a releasing angle different from each other, so that the forces exerted on the switchable member provide different tactual sensations.

10. The preset station selecting device of claim 7, wherein one insulating leg of the switchable member is provided with a recess in one side thereof, and further comprising a locking roller engaging with the recess at said one switched position of the switchable member.

11. The preset station selecting device of claim 10, wherein the other insulating leg is longer than said one leg which is provided with the recess.

12. The preset station selecting device of claim 7, wherein the switch is further provided with an insulating resilient member attached to the electrically conductive contact members, the insulating resilient member being positioned between the electrically conductive contact members and the insulating legs, and the insulating member being adapted to be pressed by the switchable member so as to push the contact member to be contacted against their corresponding groups of electrical contacts.

* * * * *